(12) United States Patent
Lin

(10) Patent No.: US 8,143,080 B2
(45) Date of Patent: Mar. 27, 2012

(54) METHOD FOR MANUFACTURING LED PACKAGE AND SUBSTRATE THEREOF

(75) Inventor: Shen-Bo Lin, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 12/941,077

(22) Filed: Nov. 7, 2010

(65) Prior Publication Data

US 2011/0256646 A1    Oct. 20, 2011

(30) Foreign Application Priority Data

Apr. 16, 2010    (CN) .......................... 2010 1 0148823

(51) Int. Cl.
*H01L 21/00* (2006.01)
(52) U.S. Cl. ............. 438/28; 438/33; 438/111; 438/113
(58) Field of Classification Search .......................... None
See application file for complete search history.

(56) References Cited

U.S. PATENT DOCUMENTS

| | | | | |
|---|---|---|---|---|
| 6,784,530 | B2 * | 8/2004 | Sugaya et al. | 257/686 |
| 2010/0289054 | A1 * | 11/2010 | Lin et al. | 257/99 |
| 2011/0186902 | A1 * | 8/2011 | Egoshi et al. | 257/99 |

* cited by examiner

*Primary Examiner* — Scott B Geyer
(74) *Attorney, Agent, or Firm* — Altis Law Group, Inc.

(57) ABSTRACT

A method for manufacturing a number of LED packages includes following steps: providing an electrode plate and at least one insulating plate; thermally pressing the electrode plate and the at least insulating plate together, wherein the electrode has a plurality of first and second electrodes; grinding two ends of the electrode plate to expose the first and second electrodes for obtaining a substrate; disposing a plurality of LED chips on the substrate plate and electrically connecting the LED chips to the first and second electrodes; and cutting the substrate plate to obtain the number of LED packages.

15 Claims, 24 Drawing Sheets

METHOD FOR MANUFACTURING LED PACKAGE AND SUBSTRATE THEREOF

BACKGROUND

1. Technical Field

The disclosure relates generally to semiconductor package technology, and more particularly to a method for manufacturing LED package and substrate thereof.

2. Description of the Related Art

Light emitting diodes (LED) are widely applied to many technical fields due to longer lifetime, lower power consumption, less heat generation, and compact size. Specifically, the LED is capable of emitting light of varied wavelengths, although most capable energy of the LED is transformed into heat and only the remained energy is transformed into light emitted. Besides heat generated from LED results ambient temperature raised that lead to lifetime and light efficiency reduction of the LED. Hence efficient thermal-dissipation is very critical for the LED packages.

Generally, the LED package comprises a substrate for carrying the LED chip, wherein heat generated from the LED chip is dissipated via the substrate to the exterior. The substrate also includes a circuit formed on the bilateral sides of the substrate by using drilling and numerous electroplating, whereby method for manufacturing the substrate is complicated. Furthermore, while thickness of the circuit is limited to compact size of the LED package, thermal dissipation of the LED package is also restricted.

DETAILED DESCRIPTION

Exemplary embodiments of the disclosure will now be described with reference to the accompanying drawings.

Figure 1:
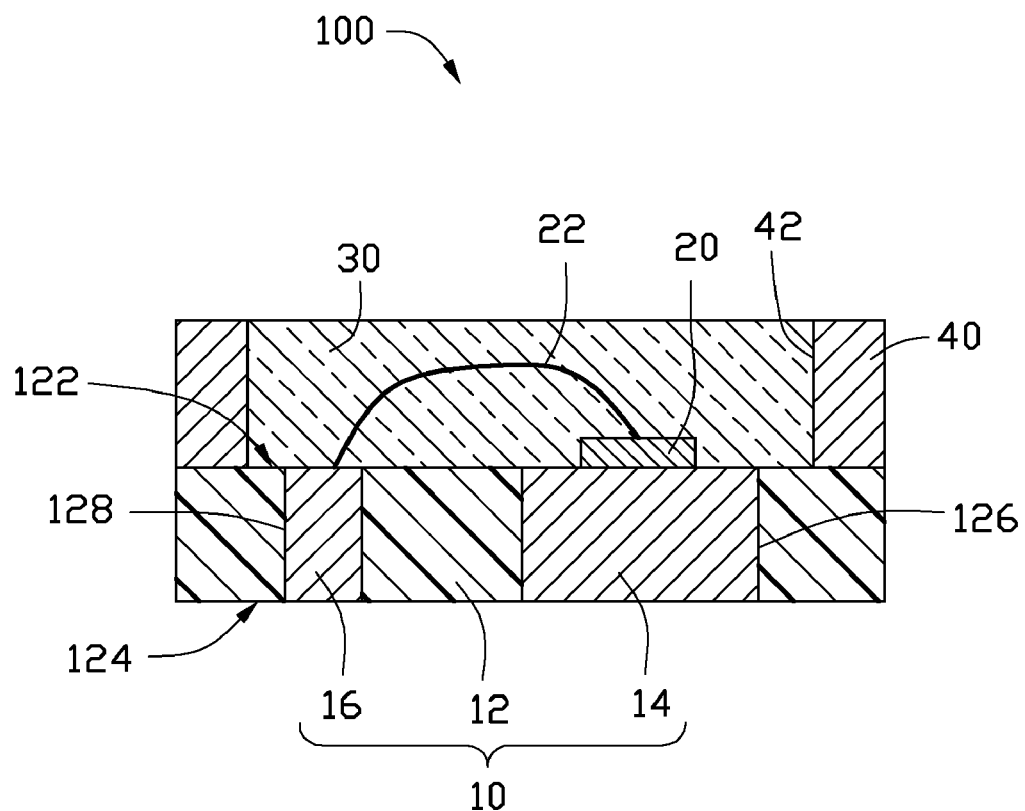
FIG. 1 is a cross section of a LED package in accordance with a first embodiment of the disclosure.

Referring to FIG. 1, the disclosure provides a first embodiment of a LED package 100 comprising a substrate 10, a LED chip 20, an encapsulation 30 and a reflector 40.

The substrate 10 comprises an insulator 12, a first electrode 14 and a second electrode 16. The insulator 12 includes a first surface 122 and a second surface 124 opposite to the first surface 122, wherein a first through hole 126 and a second through hole 128 pass through the insulator 12 from the first surface 122 to the second surface 124. The insulator 12 is thermally conductive and electrically insulating material such as epoxy, silicone, silicon oxide or a mixture thereof. The first electrode 14 and the second electrode 16 are respectively allocated inside the first through hole 126 and the second through hole 128. The first electrode 14 and the second electrode 16 are even with the insulator 12, wherein two ends of the first electrode 14 and the second electrode 16 are flush with the first surface 122 and the second surface 124. Specifically, the first electrode 14 and the second electrode 16 are highly thermally conductive and electrically conductive metal or alloy such as indium tin oxide (ITO), copper (Cu), nickel (Ni), silver (Ag), aluminum (Al), tin (Sn), gold (Au) or an alloy thereof. In the disclosure, transverse of the first electrode 14 is larger than transverse of the second electrode 16.

The LED chip 20 is disposed on the first electrode 14, wherein the LED chip 20 comprises two pads (not shown) electrically connecting to the first electrode 14 and the second electrode 16. Specifically, the LED chip 20 electrically connects to the second electrode 16 via a conductive wire 22. Moreover, transverse of the first electrode 14 is larger than transverse of the LED chip 20, whereby dissipation of heat generated from the LED chip 20 to the exterior is more efficient.

The reflector 40 is allocated on the substrate 10 to form a container 42. The LED chip 20 is disposed inside the container 42 and surrounded by the reflector 40. Accordingly, light emitted from the LED chip 20 is reflected and centralized to the exterior via the reflector 40, whereby light efficiency of the LED package 100 is enhanced.

The encapsulation 30 is allocated to fill the container 42 to protect the LED chip 20 from damage from dust or moisture. Alternatively, the encapsulation 30 further comprises at least one luminescent conversion element such as YAG, TAG, silicate, nitride, nitrogen oxides, phosphide or sulfide.

FIG. 2 and FIGS. 3A-3G show a first method for manufacturing the LED package 100 as follows.

Figure 2:
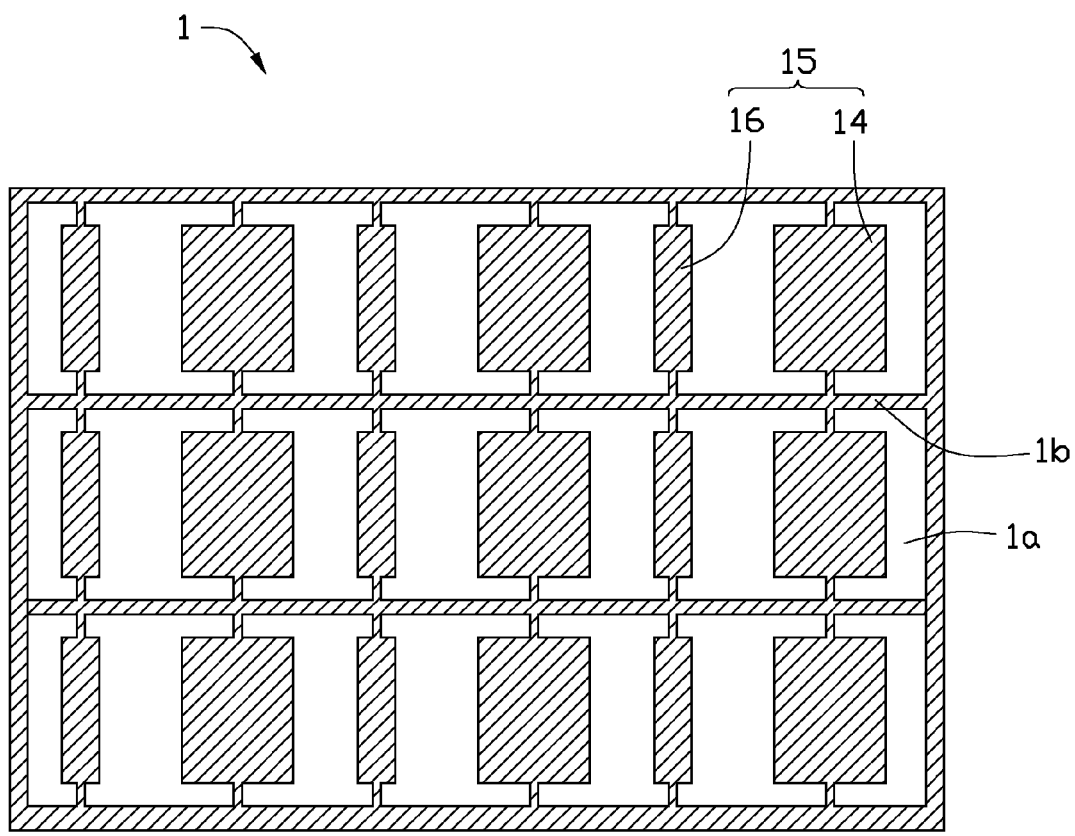
FIG. 2 is a top view of an electrode plate in accordance with a method for manufacturing the LED of FIG. 1.
Figure 3A:
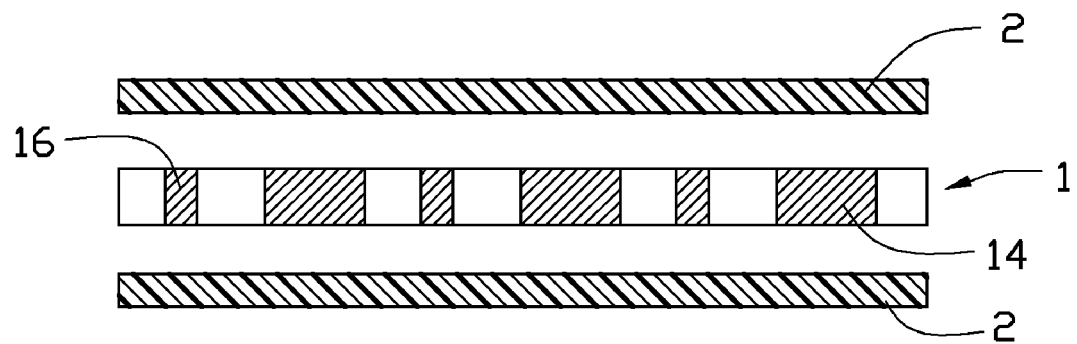
FIGS. 3A-3G are schematic diagrams in accordance with a first method for manufacturing the LED of FIG. 1.
Figure 3B:
Figure 3C:
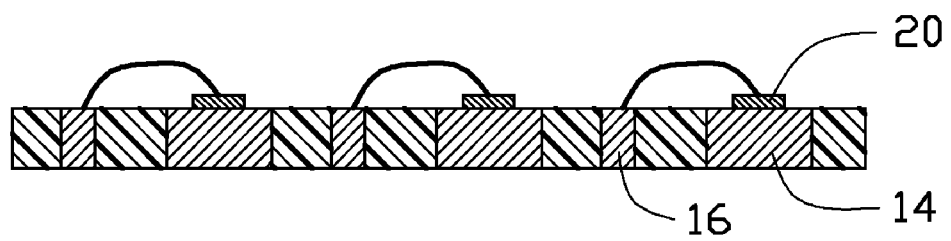
Figure 3D:
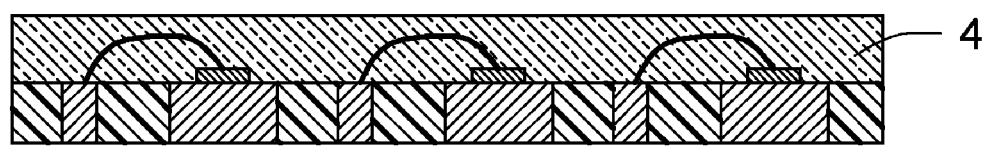
Figure 3E:
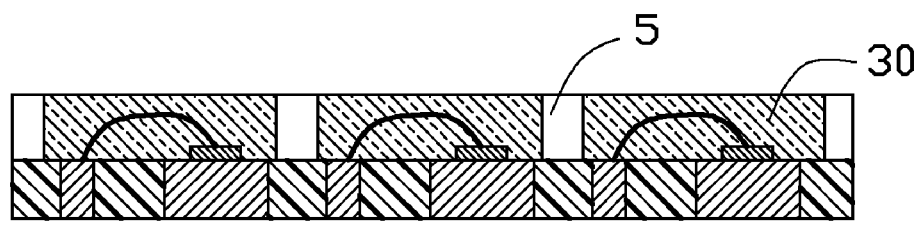
Figure 3F:
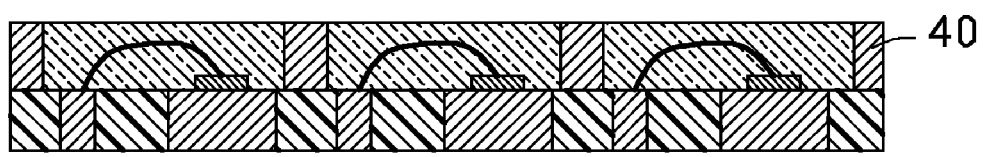
Figure 3G:
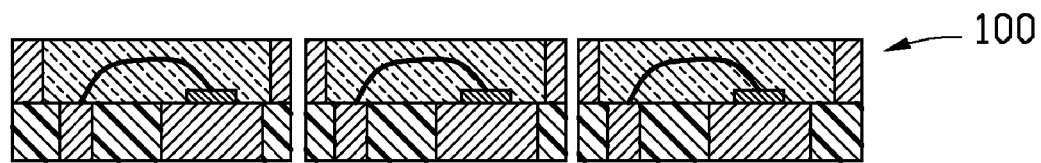

In step one, an electrode plate 1 and two insulating plates 2 are provided. Referring to FIG. 2, the electrode plate 1 comprises a plurality of electrode units 15 arranged in array, wherein each electrode unit 15 contains a first electrode 14 and a second electrode 16. Additionally, the electrode plate 1 also comprises a plurality of openings 1a around the electrode units 15 and a plurality of strips 1b between each electrode unit 15 to sustain the first electrode 14 and the second electrode 16. In the disclosure, the electrode plate 1 is metal or alloy such as indium tin oxide (ITO), copper (Cu), nickel (Ni), silver (Ag), aluminum (Al), tin (Sn), gold (Au) or an alloy thereof.

In step two, the electrode plate 1 is allocated between two insulating plates 2; at the same time, the first electrode 14 and the second electrode 16 are wrapped within the insulating plates 2 by thermal pressing, as shown in FIG. 3. Thereafter, two ends of the electrode plate 1 are ground to expose the first electrodes 14 and the second electrodes 16 for obtaining a substrate plate 3. Particularly, the insulating plate 2 can be single unit or multiple units for wrapping the first electrode 14 and the second electrode 16.

In step three, a plurality of LED chips 20 is disposed on the first electrodes 14, each corresponding to one first electrode 14 and electrically connecting to one second electrode 16 by a conductive wire.

In step four, a cover layer 4 is formed on the substrate plate 3, encapsulating the LED chips 20. Alternatively, the cover layer 4 can comprise at least one luminescent conversion element of YAG, TAG, silicate, nitride, nitrogen oxides, phosphide or sulfide. Specifically, the cover layer 4 is formed on the substrate plate 3 by molding or coating.

In step five, a plurality of grooves 5 is allocated on the cover layer 4 to divide the cover layer 4 into a plurality of encapsulations 30.

In step six, a plurality of reflectors 40 is formed inside the plurality of grooves 5. Specifically, the plurality of reflectors 40 is formed on the substrate plate 3 by molding or coating.

In step seven, the substrate plate 3 is cut into a number of LED packages 100.

Figure 4A:
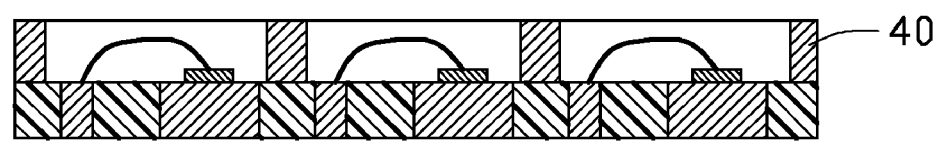
FIGS. 4A-4C are schematic diagrams in accordance with a second method for manufacturing the LED of FIG. 1.
Figure 4B:
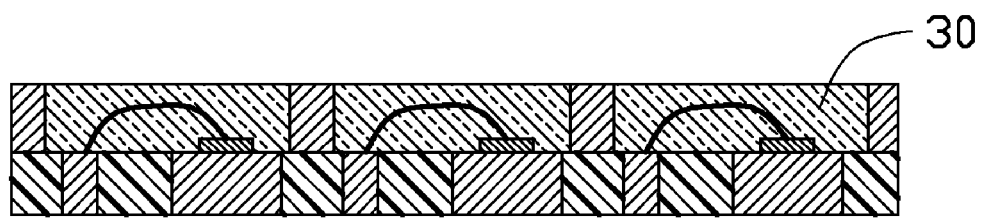
Figure 4C:
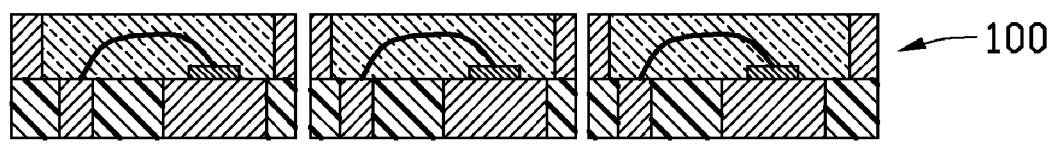
Figure 5A:
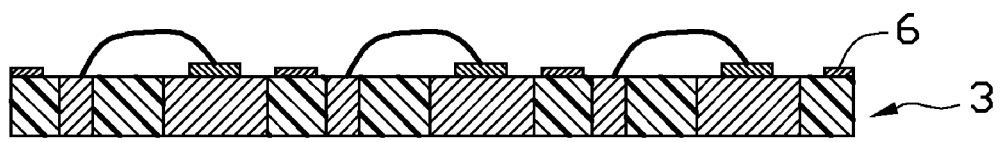
FIGS. 5A-5E are schematic diagrams in accordance with a third method for manufacturing the LED of FIG. 1.
Figure 5B:
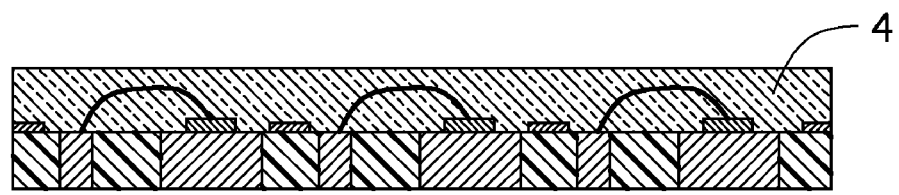
Figure 5C:
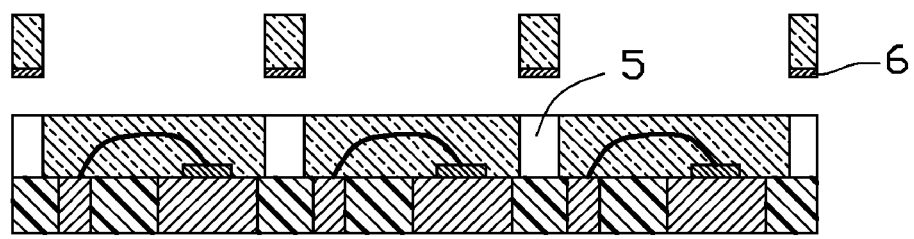
Figure 5D:
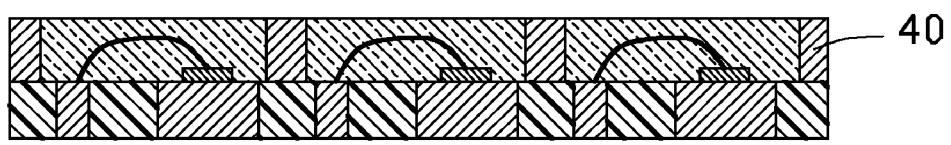
Figure 5E:
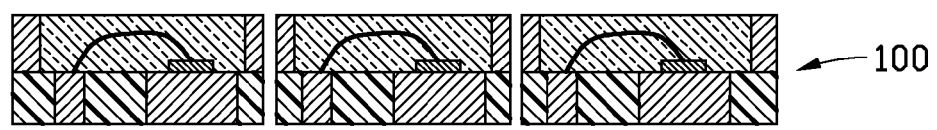

Referring to FIGS. 4A-4C, a second method for manufacturing the LED package 100 according to the disclosure is as follows, differing from the first method only in the reflectors 40 being formed before the plurality of encapsulations 30. The plurality of encapsulations 30 is surrounded by the reflectors 40. Specifically, the encapsulations 30 are formed by injection or dripping.

Referring to FIGS. 5A-5E, a third method for manufacturing the LED package 100 according to the disclosure is as follows, differing from the first method only in the presence of a dummy mold 6 allocated on the substrate plate 3 before the cover layer 4 is formed on the substrate plate 3. More specifically, the cover layer 4 is formed on the dummy mold 6 and the substrate plate 3 such that the dummy mold 6 is sandwiched between the cover layer 4 and the substrate plate 3. Thereafter, the dummy mold 6 is removed from the substrate plate 3, such that a portion of the cover layer 4 above the dummy mold 6 is removed simultaneously from the substrate plate 3 and a plurality of grooves 5 is allocated on the cover layer 4. After that, a plurality of reflectors 40 is formed inside the plurality of grooves 5. In the disclosure, the dummy mold 6 is an integrated film for conveniently lifting from the substrate plate 3.

Figure 6:
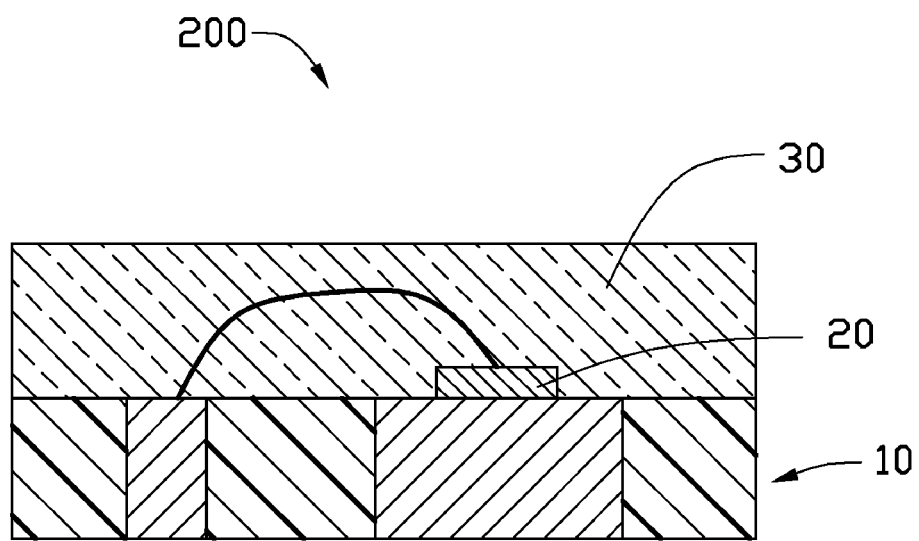
FIG. 6 is a cross section of a LED package in accordance with a second embodiment of the disclosure.

Referring to FIG. 6, the disclosure provides a second embodiment of a LED package 200 differing from the first embodiment only in the presence of the LED package 200 having no reflector on the substrate 10.

Figure 7A:
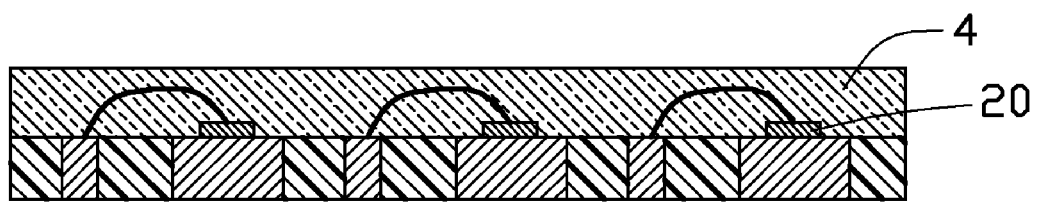
FIGS. 7A-7B are schematic diagrams in accordance with a method for manufacturing the LED of FIG. 6.
Figure 7B:
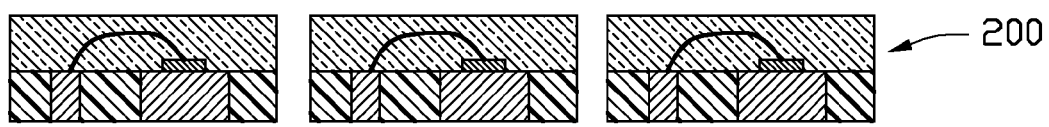

Referring to FIGS. 7A-7B, a method for manufacturing the LED package 200 according to the disclosure is as follows, differing from the method for manufacturing the LED package 100 only in the presence of the cover layer 4 and the substrate plate 3 being cut to obtain a plurality of LED packages 200 following formation of the cover layer 4.

Figure 8:
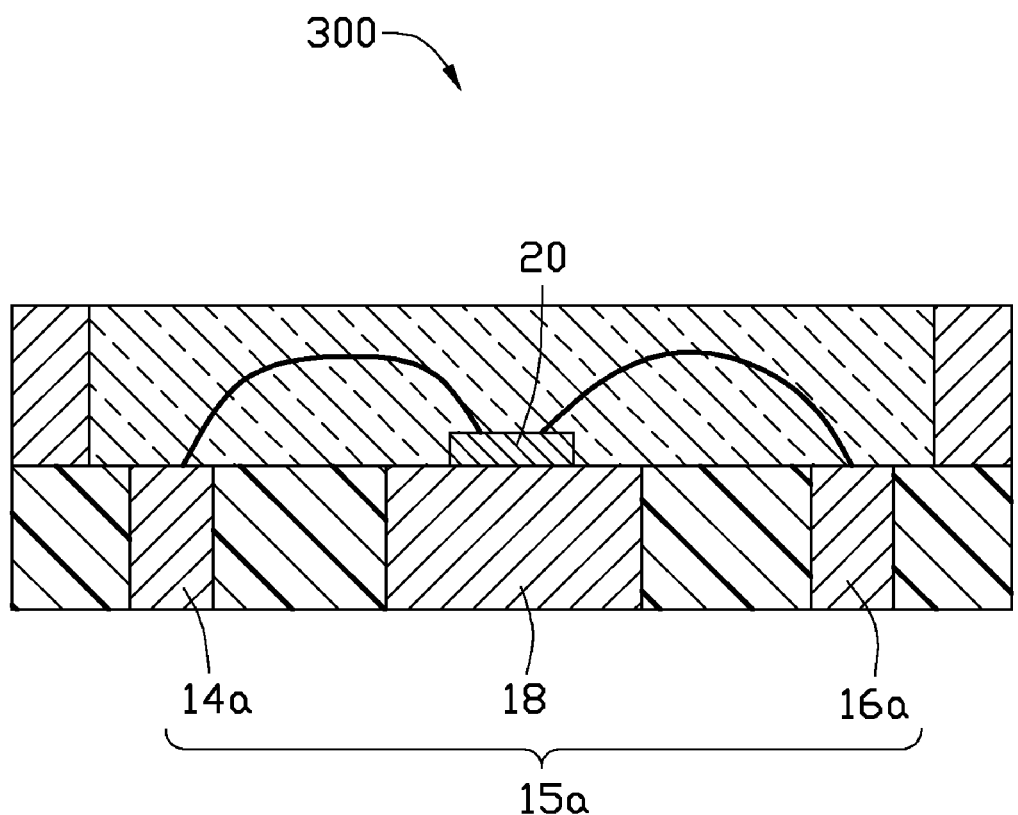
FIG. 8 is a cross section of a LED package in accordance with a third embodiment of the disclosure.

Referring to FIG. 8, a third embodiment of a LED package 300 differs from the first embodiment only in that the LED package 300 comprises an electrode unit 15a containing a first electrode 14a, a second electrode 16a and a thermally conductive block 18. Moreover, the thermally conductive block 18 disconnects from the first electrode 14a and the second electrode 16a. The LED chip 20 is disposed on the thermally conductive block 18 and electrically connects to the first electrode 14a and the second electrode 16a via conductive wires. In the disclosure, the thermally conductive block 18, the first electrode 14a and the second electrode 16a are identical material.

Figure 9A:
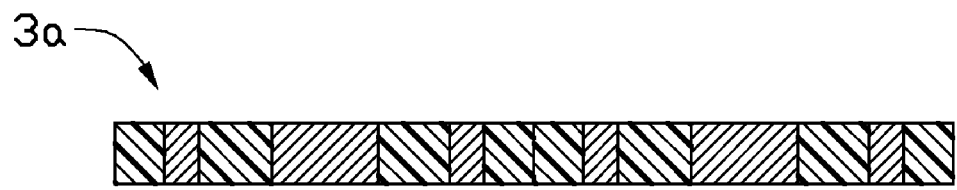
FIGS. 9A-9C are schematic diagrams in accordance with a method for manufacturing the LED of FIG. 8.
Figure 9B:
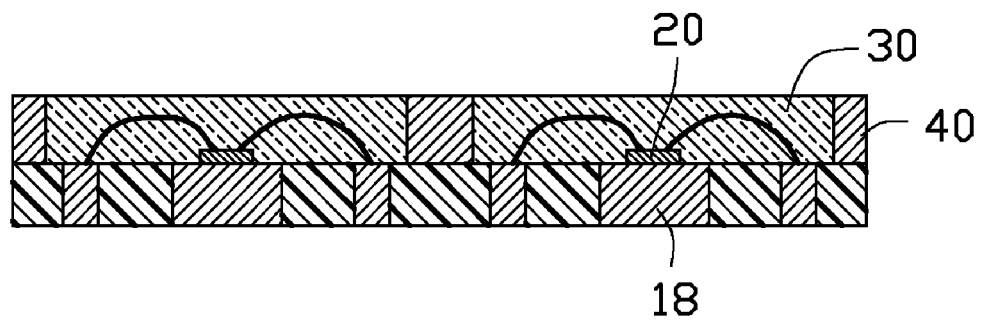
Figure 9C:
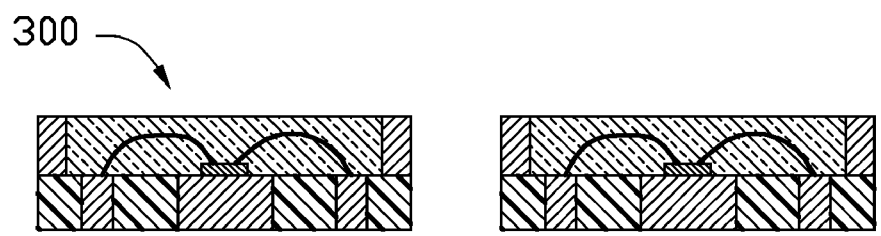

Referring to FIG. 9A-9C, a method for manufacturing the LED package 300 according to the disclosure is as follows, differing from the method for manufacturing the LED package 100 only in the presence of the LED chips 20 disposed on the thermally conductive blocks 18 of the substrate plate 3a.

According to the method for manufacturing LED package and the substrate thereof, the substrate of the LED package is formed by thermal pressing and grinding with no drilling or electroplating required. Moreover, thickness and thermal resistance of the substrate are reduced, but light emitting efficiency of the LED chip is enhanced. Further, cost for manufacturing the LED package is diminished, because only a minority of metal is required to manufacture the substrate.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for manufacturing a number of LED packages, comprising following steps:
   providing an electrode plate and at least one insulating plate, wherein the electrode plate comprises a number of electrode units, each of the electrode units having a first electrode and a second electrode;
   thermally pressing the electrode plate and the at least one insulating plate to have the first electrode and the second electrode wrapped by the at least one insulating plate;
   grinding two ends of the electrode plate to expose the first electrodes and the second electrodes for obtaining a substrate plate;
   disposing a plurality of LED chips on the substrate plate and electrically connecting the plurality of LED chips to the first electrodes and the second electrodes; and
   cutting the substrate plate to obtain the number of LED packages.

2. The method for manufacturing a number of LED packages as claimed in claim 1, further comprising a step of forming a cover layer encapsulating the LED chips before the step of cutting the substrate plate to obtain the number of LED packages.

3. The method for manufacturing a number of LED packages as claimed in claim 2, further comprising a step of forming a plurality of grooves on the cover layer to divide the cover layer into a plurality of encapsulations.

4. The method for manufacturing a number of LED packages as claimed in claim 3, wherein each of the encapsulations comprises at least one luminescent conversion element selected from YAG, TAG, silicate, nitride, nitrogen oxides, phosphide and sulfide.

5. The method for manufacturing a number of LED packages as claimed in claim 3, further comprising a step of allocating a dummy mold on the substrate plate before the step of forming the cover layer encapsulating the number of LED chips, wherein the plurality of grooves is formed via removing the dummy mold from the substrate plate.

6. The method for manufacturing a number of LED packages as claimed in claim 3, further comprising a step of forming a plurality of reflectors on the substrate plate, wherein the plurality of reflectors is formed inside the plurality of grooves.

7. The method for manufacturing a number of LED packages as claimed in claim 1, further comprising a step of forming a plurality of reflectors on the substrate plate to form a plurality of containers before the step of cutting the substrate plate to obtain the number of LED packages, wherein the LED chips are disposed inside the containers.

8. The method for manufacturing a number of LED packages as claimed in claim 7, further comprising a step of forming a plurality of encapsulations inside the plurality of containers, wherein the plurality of encapsulations is surrounded by the reflectors.

9. The method for manufacturing a number of LED packages as claimed in claim 8, wherein each of the encapsulations comprises at least one luminescent conversion element selected from YAG, TAG, silicate, nitride, nitrogen oxides, phosphide and sulfide.

10. The method for manufacturing a number of LED packages as claimed in claim 1, wherein the electrode units are arranged in array.

11. The method for manufacturing a number of LED packages as claimed in claim 1, wherein each of the electrode units further comprises a thermally conductive block, and the LED chips are disposed on the thermally conductive blocks.

12. The method for manufacturing a number of LED packages as claimed in claim 11, wherein each of the thermally conductive blocks disconnects from the first electrode and the second electrode of a corresponding electrode unit.

13. A method for manufacturing a substrate for manufacturing a plurality of LED packages, comprising following steps:
    providing an electrode plate and at least one insulating plate, wherein the electrode plate comprises a plurality of electrode units, each of the electrode units having a first electrode and a second electrode;
    thermal pressing the electrode plate and the at least one insulating plate to have the first electrode and the second electrode wrapped by the at least one insulating plate;
    grinding two ends of the electrode plate to expose the first electrodes and the second electrodes for obtaining the substrate plate.

14. The method for manufacturing a substrate for manufacturing a plurality of LED packages as claimed in claim 13, wherein each of the electrode units further comprises a thermally conductive block, wherein each of the thermally conductive blocks respectively disconnects from the first electrode and the second electrode of a corresponding electrode unit.

15. The method for manufacturing a substrate for manufacturing a plurality of LED packages as claimed in claim 13, wherein the electrode units are arranged in array.

* * * * *